(12) United States Patent
Kumar et al.

(10) Patent No.: US 6,879,198 B2
(45) Date of Patent: Apr. 12, 2005

(54) DIFFERENTIAL INPUT RECEIVER WITH HYSTERESIS

(75) Inventors: Manoj Kumar, New Delhi (IN); Rajesh Narwal, Haryana (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/739,879

(22) Filed: Dec. 18, 2003

(65) Prior Publication Data

US 2004/0155689 A1 Aug. 12, 2004

(30) Foreign Application Priority Data

Dec. 18, 2002 (IN) .................................. 1275/DEL/2002

(51) Int. Cl.[7] .............................................. H03K 3/037
(52) U.S. Cl. ............................ 327/206; 327/77; 327/87
(58) Field of Search ................................ 327/205, 206, 327/108, 66, 67, 77, 87, 562, 563; 326/82, 83; 330/253, 257, 260

(56) References Cited

U.S. PATENT DOCUMENTS

| | | | |
|---|---|---|---|
| 5,666,068 A | 9/1997 | Ehmann | 326/63 |
| 5,796,281 A * | 8/1998 | Saeki et al. | 327/206 |
| 6,204,696 B1 * | 3/2001 | Krishnamurthy et al. | 327/206 |

\* cited by examiner

Primary Examiner—Long Nguyen
(74) Attorney, Agent, or Firm—Lisa K. Jorgenson; Allen, Dyer, Doppelt, Milbrath & Gilchrist, P.A.

(57) ABSTRACT

A differential input receiver with hysteresis on both sides of the reference voltage may include a two-input, one-output differential amplifier including two input transistors having a common terminal connected together. The control terminal of each transistor may be connected to one of the inputs of the differential amplifier. The output of the differential amplifier may be connected to a set of cascaded digital inverters/buffers, and an output of each digital buffer may be connected to the control terminal of a feedback transistor. The feedback transistor may be connected in parallel across each of the input transistors so that when one input voltage increases above or decreases below the input voltage at the second input by a predetermined threshold value, the feedback transistors operate to provide positive feedback to facilitate a rapid switching action at the output.

16 Claims, 7 Drawing Sheets

DIFFERENTIAL INPUT RECEIVER WITH HYSTERESIS

FIELD OF THE INVENTION

The present invention relates to electronic circuits, and, more particularly, to differential input receivers with hysteresis and related methods.

BACKGROUND OF THE INVENTION

Differential signaling techniques, which are also known as balanced input signaling techniques, have distinct advantages in providing immunity to noise pickup and crosstalk between channels. These techniques are often used for preventing false output due to noise or interference pickup at the input. For applications where the switching speed is high, the probability of noise influence is greater, and hysteresis becomes important for proper operation.

Referring to FIG. 1, a conventional prior art differential signal receiver 10 without hysteresis illustratively includes a current mirror biasing circuit formed by MOS transistors P1, N1 and P2. PMOS transistors P3 and P4 are the input transistors whose gates are connected to an input voltage IN and a reference voltage VREF, respectively. NMOS transistors N2 and N3 are the current mirror load transistors.

The source of the biasing PMOS transistor P1 is connected to VDD, while its gate and drain are connected together and to the gate of the PMOS transistor P2 and the drain of the NMOS transistor N1. The gate and drain of the NMOS transistor N1 are connected together, while its source is connected to ground. Since the drain and gate of the transistors P1 and N1 are shorted, these transistors always remain in saturation. The source of the PMOS transistor P2 is connected to VDD, while its drain is connected to the sources of the input PMOS transistors P3 and P4. The drains of the PMOS transistors P3 and P4 are connected to the drains of the NMOS transistors N2 and N3, respectively. The gates of the NMOS transistors N2 and N3 are connected together and to the drain of the NMOS transistor N2, while their sources are connected to ground.

The current mirror circuit provides a constant current through the receiver. When the input voltage IN is less than the reference voltage VREF, the resistance of the PMQS transistor P3 becomes less than that of the PMOS transistor P4. Therefore, the current in the input transistor branch (which includes the transistors P3 and N2) increases, while the current in the reference voltage transistor branch (which includes the transistors P4 and N3) decreases by an equal amount. This makes the output voltage VOUT_prior low. Similarly, when the input voltage IN is greater than the reference voltage VREF, the current in the P4-N3 transistor branch decreases, while that in the P3-N2 transistor branch increases by the same amount, and the output voltage VOUT_prior goes high. In this manner, the differential input receiver functions as a comparator whose trip point is set at the reference voltage VREF.

This type of differential input receiver is, however, susceptible to noise when the input voltage is close to the trip point of the differential input receiver. The influence of such noise can be seen in FIG. 2, which shows the waveforms for a conventional prior art differential receiver. As may be seen, the noise results in large false spikes which, in turn, results in incorrect functioning of the circuit.

Turning now additionally to FIG. 3, waveforms of a differential receiver without hysteresis and of a differential input receiver having hysteresis are shown. Whenever the input crosses the reference voltage (here 0.75V), the output V(OUT)_prior of a differential receiver without hysteresis switches. Yet, the output V(OUT) of a differential receiver with hysteresis goes high only when the input goes beyond VTH (here 0.84V), and it remains high until the input signal IN goes lower than VTL (here 0.66V), thereby providing a greater noise immunity.

Hysteresis enables suppression of the effect of noise by adjusting the threshold voltage based upon the output voltage, setting a higher threshold voltage VTH or a lower threshold voltage VTL, as shown in FIG. 4. The higher threshold voltage VTH is the threshold value when the output is low, while the lower threshold voltage VTL is the threshold value when the output is high. This arrangement ensures that the output goes low only when the input becomes greater than VTH, and will go high only when the input drops below the lower threshold VTL. This provides an input noise margin of VTH-VTL.

U.S. Pat. No. 5,796,281 describes a differential input receiver 30 with hysteresis, which is shown in FIG. 5. A PMOS transistor Q2 is connected in parallel with a reference voltage transistor Q1 to provide hysteresis. The input to the transistor Q2 is the output of the input stage Vout. Since the output of the input buffer is never at a strong logic low, significant hysteresis is only possible with a relatively large size transistor Q2. Furthermore, this circuit provides hysteresis only in one direction.

U.S. Pat. No. 5,666,068 describes a differential input receiver 40 with hysteresis as shown in FIG. 6. In this circuit, parallel transistors P8 and P9 are used to provide hysteresis. The inputs VIN1 and VIN2 are for the input signals of the receiver 40. Since this signal level is small here as well, the transistors P8 and P9 are required to be large in size to provide adequate hysteresis. In addition, this arrangement reduces the input impedance of the receiver 40.

SUMMARY OF THE INVENTION

An object of the invention is to provide a differential input receiver with hysteresis to achieve higher immunity to noise occurring at the input or in the reference voltage for improved performance.

Another object of the invention is to provide a differential input receiver with high common mode rejection ratio by providing symmetrical input configurations with high impedances.

Still another object of the invention is to provide a differential input receiver with hysteresis, using relatively small transistor sizes.

Yet another object of the invention is to provide a differential input receiver with hysteresis characteristics that are symmetric about the reference voltage to achieve better noise immunity at both low-to-high and high-to-low transitions.

To achieve these objectives, a differential receiver in accordance with the present invention provides symmetrical hysteresis while requiring only relatively small transistors. More particularly, the differential receiver may include a two-input, one-output differential amplifier including two input transistors having a common terminal coupled together. The control terminal of each transistor may be coupled to one input of the differential amplifier.

An output of the differential amplifier may be connected to a set of cascaded digital inverters/buffers. Further, the output of each digital buffer may be connected to the control terminal of a feedback transistor connected in parallel across each of the input transistors. This is done such that when one input voltage increases above or decreases below the input voltage at the second input by a predetermined threshold value, the feedback transistors provide positive feedback to facilitate a rapid switching action at the output. One input terminal may be connected to a reference voltage, while the second input may receive the input voltage, thus forming a comparator with hysteresis.

A method of improving a differential receiver in accordance with the invention may include providing a two-input, one-output differential amplifier including two input transistors having a common terminal connected together, with the control terminal of each transistor being connected to one input of the differential amplifier. Further, the output of the differential amplifier may be connected to a set of cascaded digital inverters/buffers. The method may also include coupling the output of each digital buffer to the control terminal of a feedback transistor connected in parallel across each of the input transistors. Again, this is done such that when one input voltage increases above or decreases below the input voltage at the second input by a predetermined threshold value, the feedback transistors provide positive feedback to facilitate a rapid switching action at the output.

BRIEF DESCRIPTION OF THE DRAWINGS

The invention will now be described with reference to the following drawings, in which.

DETAILED DESCRIPTION OF THE PREFERRED EMBODIMENTS

Figure 1:
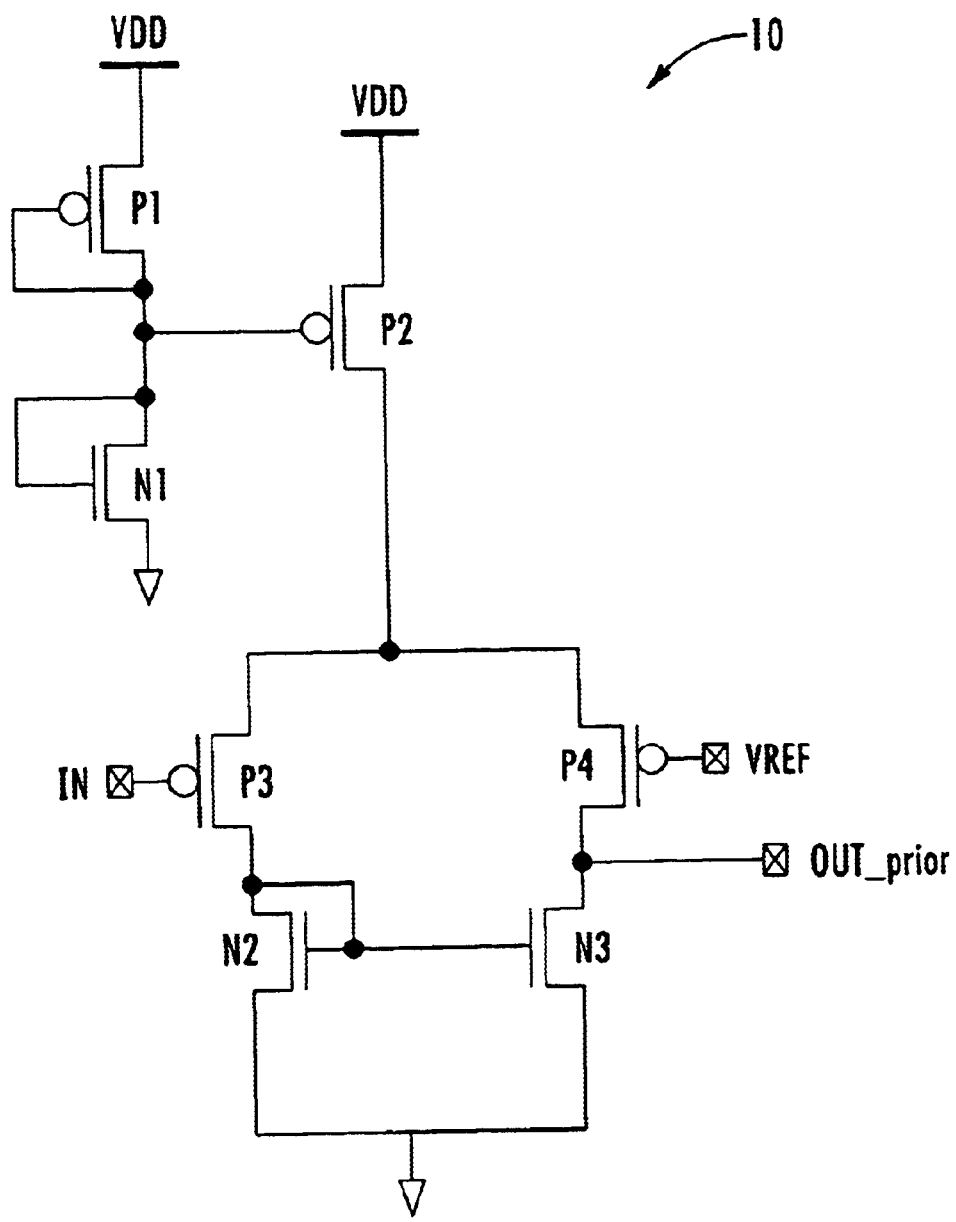
FIG. 1 is a schematic circuit diagram of a conventional prior art PMOS differential input receiver.
Figure 2:
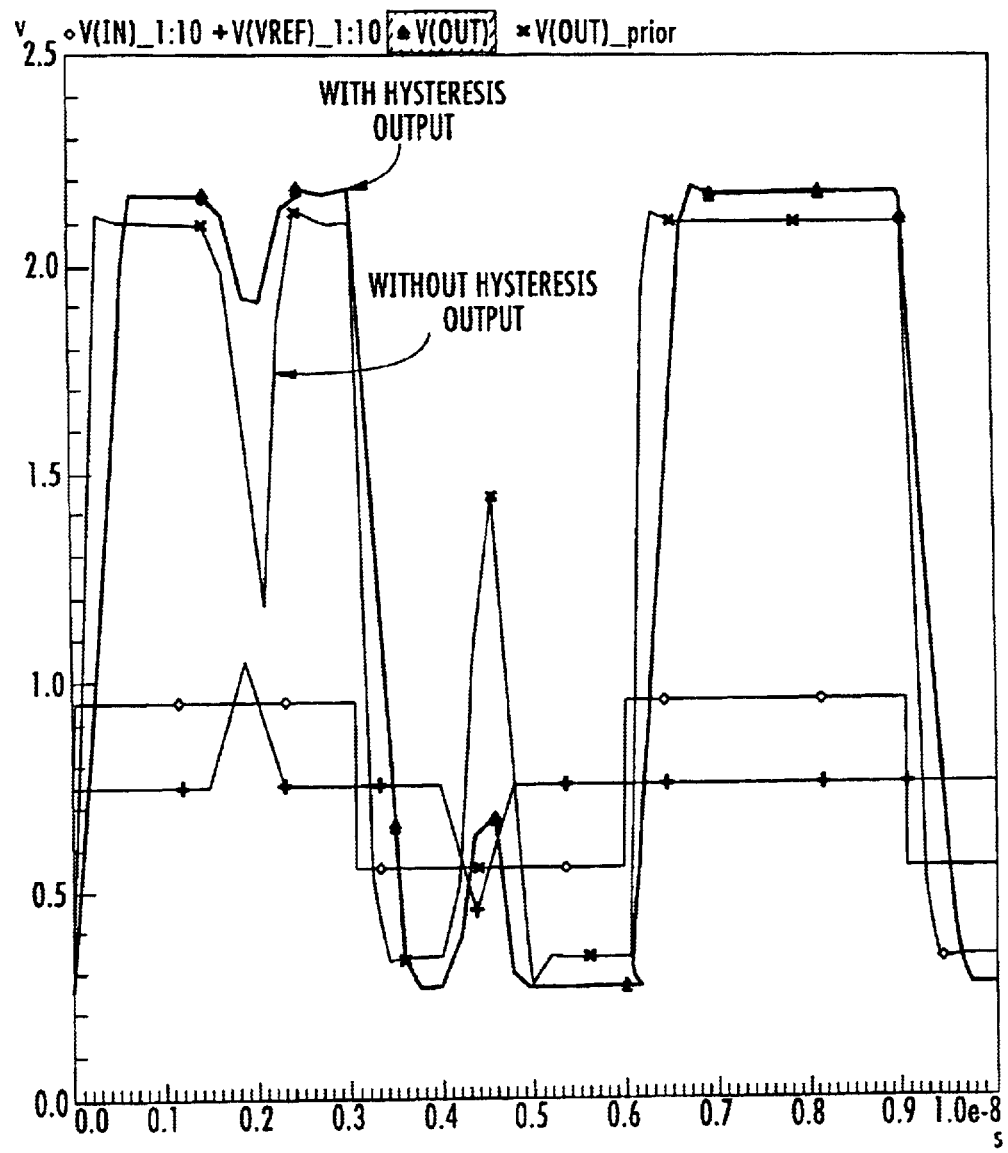
FIG. 2 is a waveform diagram illustrating the effects of noise occurring at a reference voltage node in accordance with the prior art.
Figure 3:
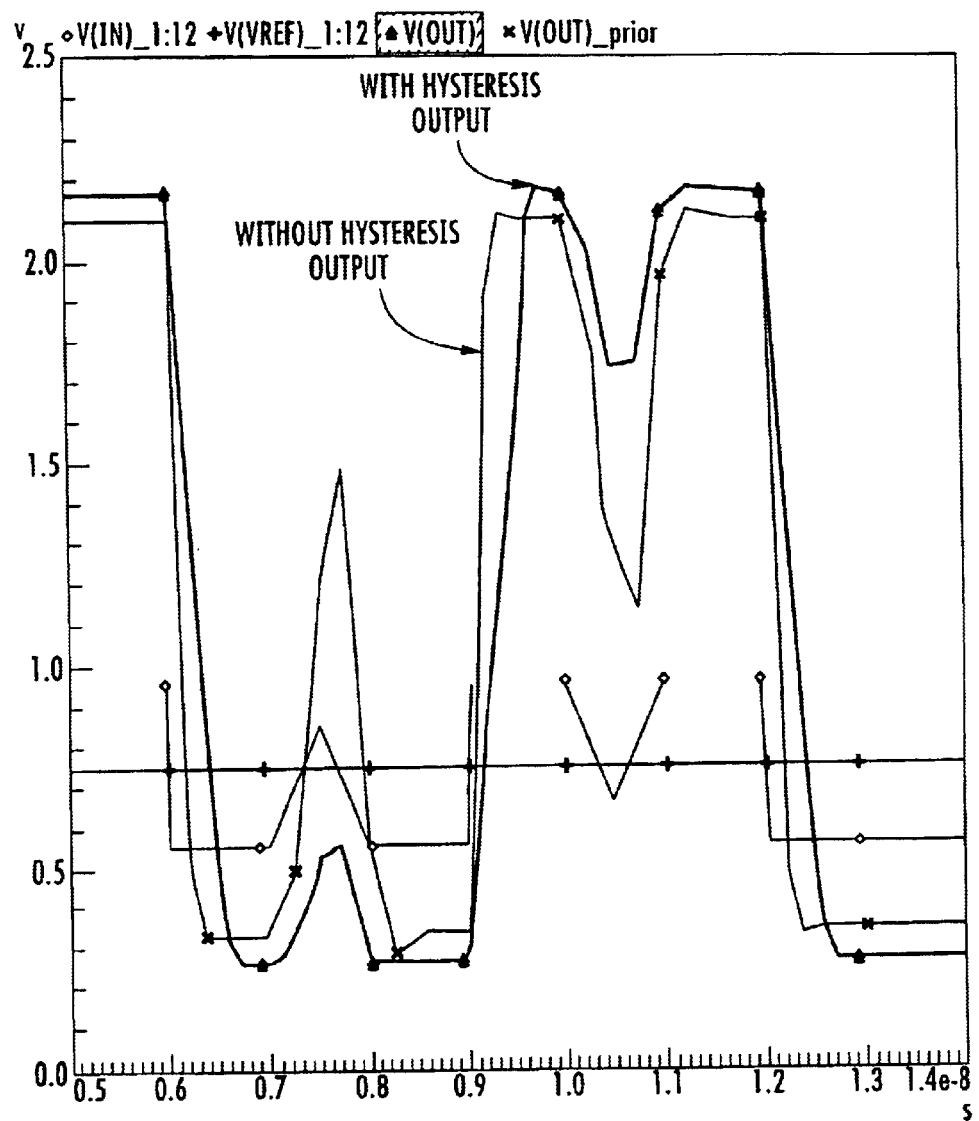
FIG. 3 is a waveform diagram illustrating the effects of noise on an input voltage for a differential input receiver with hysteresis in accordance with the prior art.
Figure 4:
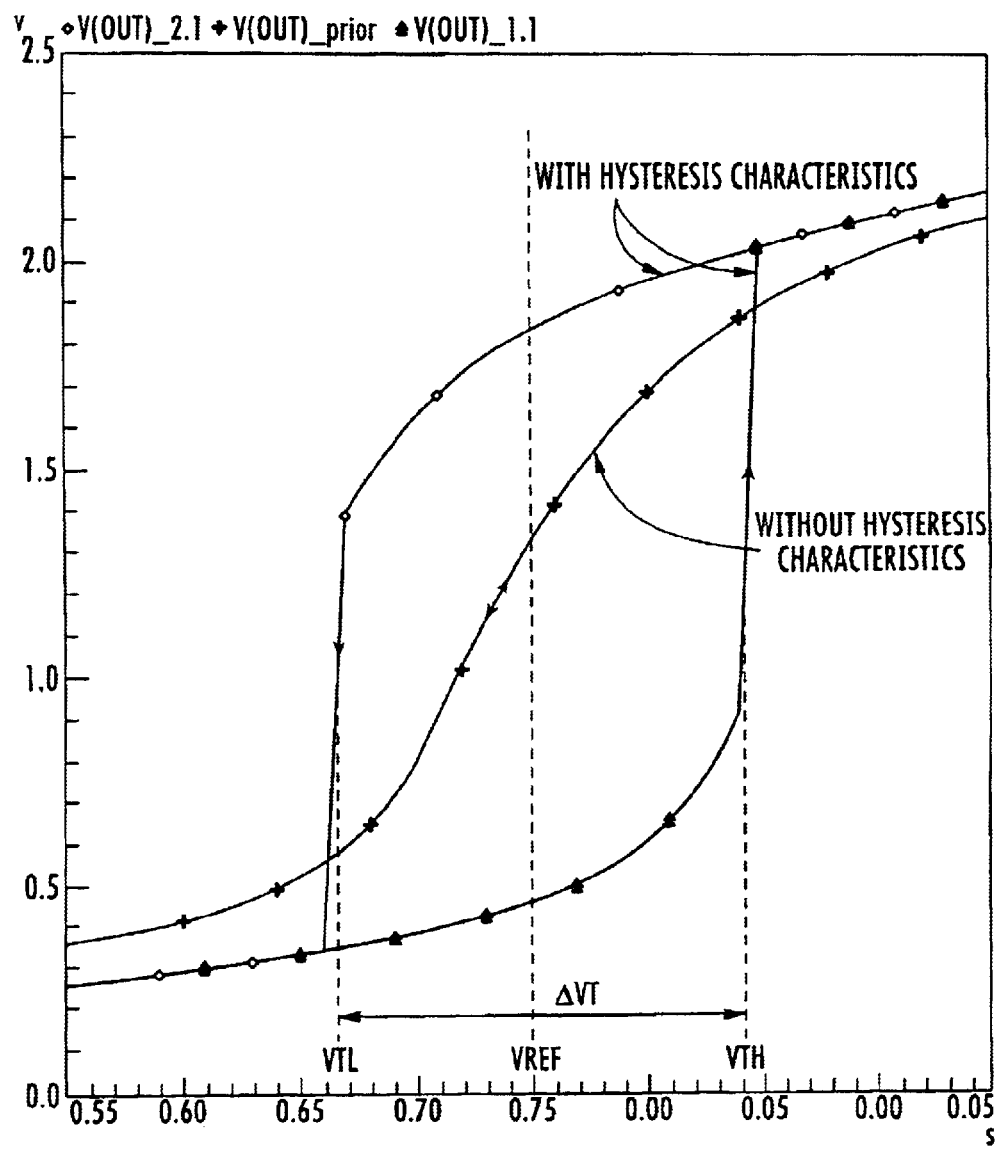
FIG. 4 is a graph illustrating the DC characteristics of a differential receiver with hysteresis in accordance with the prior art.
Figure 5:
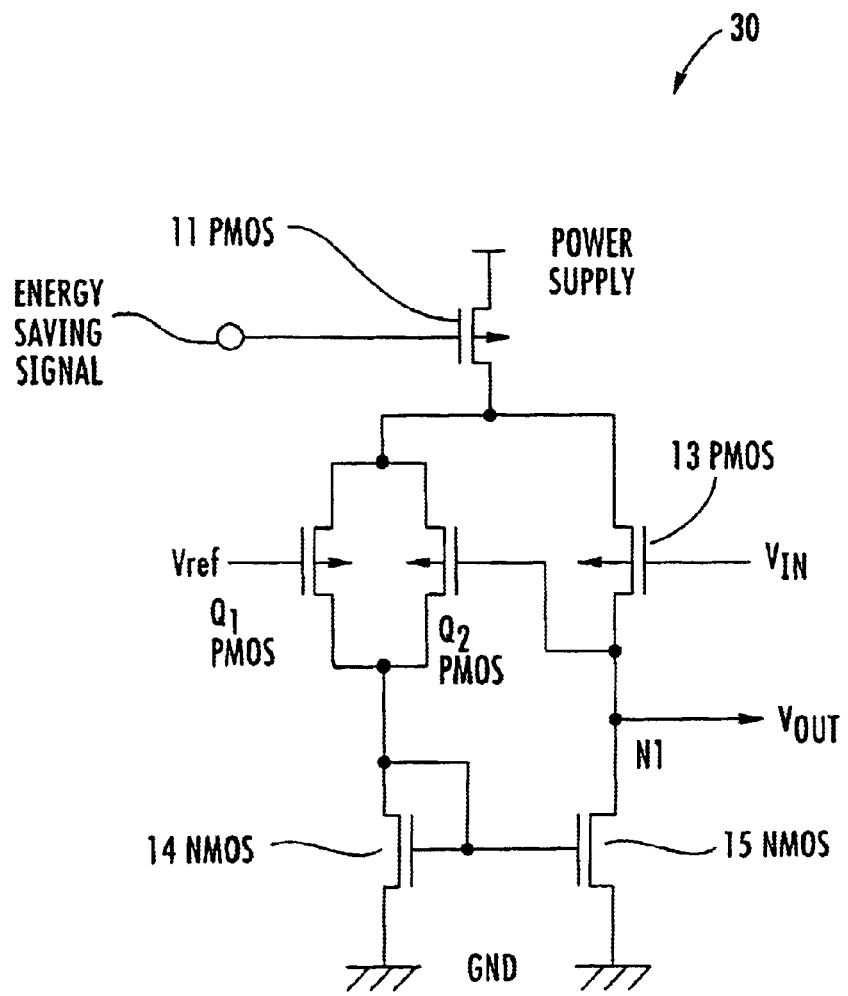
FIG. 5 is a schematic circuit diagram of a differential input receiver in accordance with the prior art.
Figure 6:
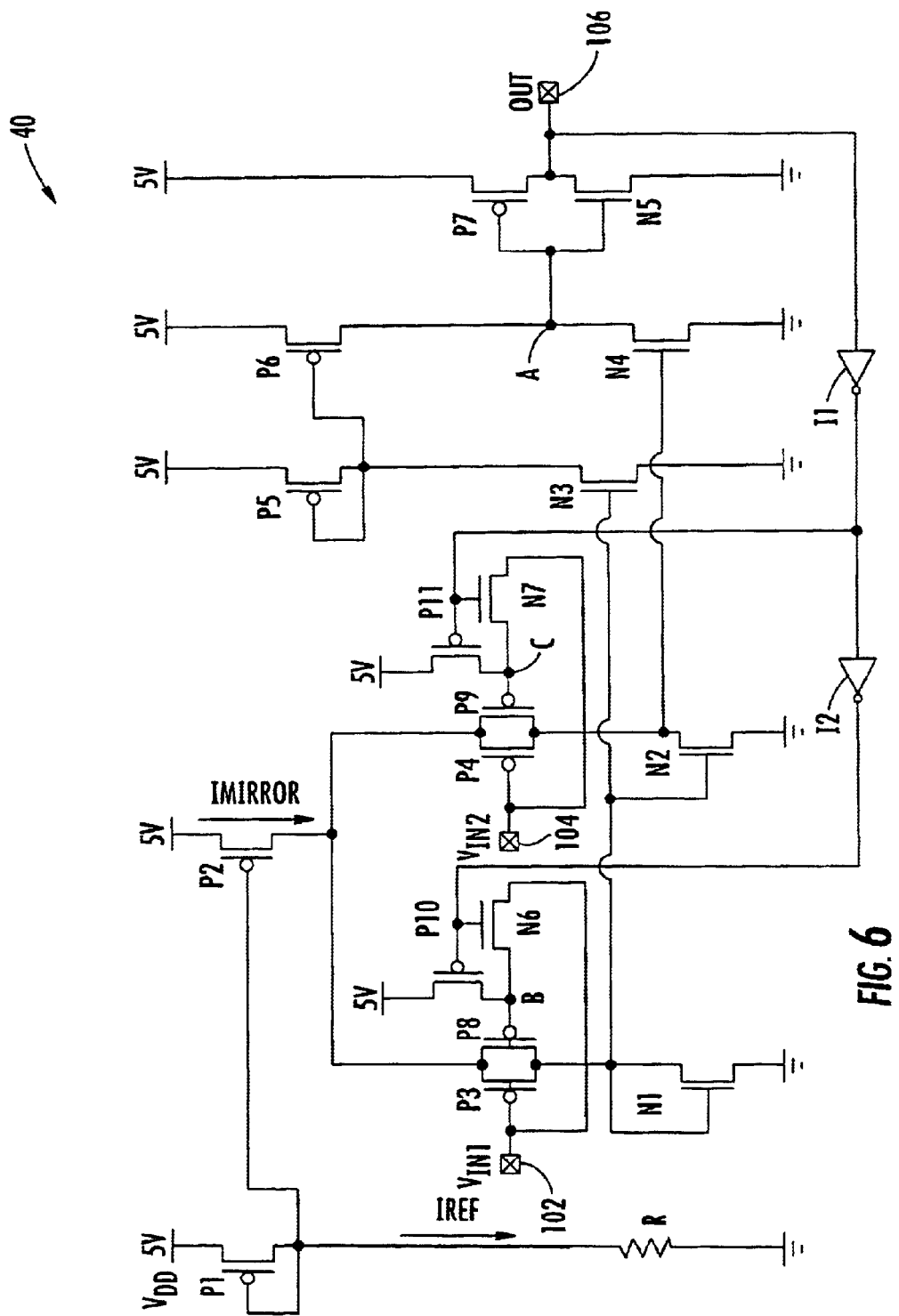
FIG. 6 is a schematic circuit diagram of another differential input receiver in accordance with the prior art.
Figure 7:
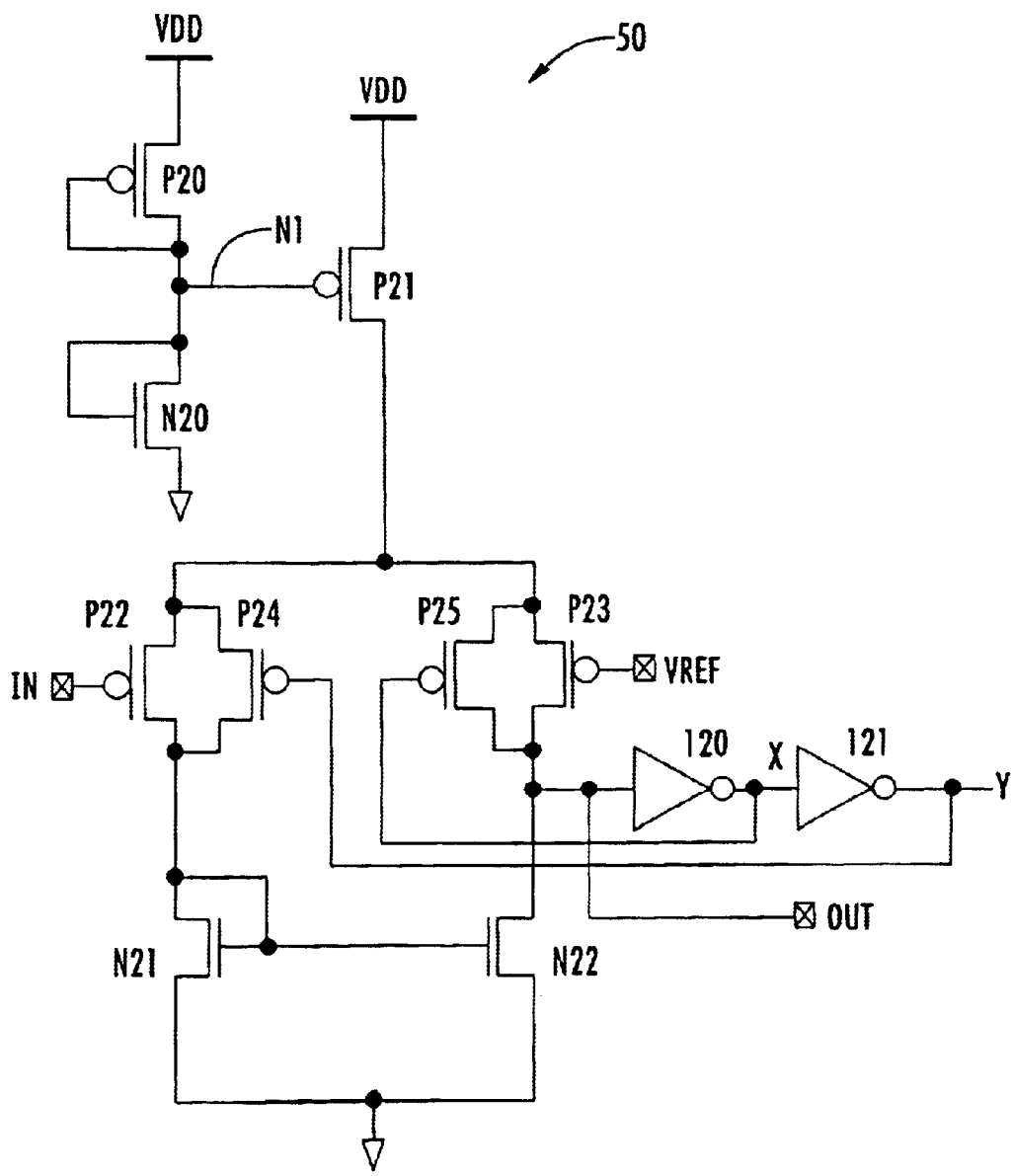
FIG. 7 is a schematic circuit diagram of a differential input receiver in accordance with the present invention.

Turning now to FIG. 7, a differential input receiver 50 according to the present invention illustratively includes pass transistors P20, N20 and P21 which form a current mirror circuit. The metal oxide semiconductor (MOS) transistors P20 and N20 together act as a potential divider that controls the voltage at a node N1, and thus the current flowing through the transistor P21 and the rest of the circuit.

A symmetrical input voltage transistor branch includes transistors P22, P24 and N21, and a reference voltage transistor branch includes transistors P23, P25 and N22. The sources of the MOS transistors P20 and N20 are connected to VDD and ground, respectively, while the gates of the MOS transistors N20 and P20 are connected to the drains of the same transistors. The source of the PMOS transistor P21 is connected to the supply voltage VDD, while its drain is connected to the sources of the PMOS transistors P22, P23, P24 and P25.

The PMOS transistors P22 and P23 are the input voltage transistor and reference voltage transistor, and their gates are connected to the input voltage signal IN and the reference voltage VREF, respectively. The drains of the PMOS transistors P22 and P23 are connected to the drains of the NMOS transistors N21 and N22. The PMOS transistors P24 and P22, and the PMOS transistors P25 and P23, are connected in parallel. The gates of the PMOS transistors P24 and P25 are connected to the output of inverters I20 and I21, respectively.

The NMOS transistor N21 has its drain and gate shorted and connected to the gate of the NMOS transistor N22. The NMOS transistors N21 and N22 have their sources connected to ground. The input terminal of the inverter I20 is connected to the drains of the MOS transistors P23, P25 and N22, which is also connected to an output node OUT. An output node X taken at the output of the inverter I20 is connected to the input of the inverter I21.

The operation of the circuit 50 will now be analyzed for two cases, namely a low-to-high transition and a high-to-low transition. First the low-to-high transition will be considered. In this case, the input voltage IN is initially less than the reference voltage VREF. The output voltage OUT is low, the voltage at the node X is high, while the voltage at the node Y is low. Consequently, the PMOS transistors P24 and P25 are ON and OFF, respectively. Since the input voltage IN is less than the reference voltage VREF, the resistance of the transistor P22 is less than the resistance of the transistor P23. Further, since the transistor P25 is OFF and the transistor P24 is ON, the effective resistance of the transistors P22 and P24 is smaller than the effective resistance of transistors P23 and P25, resulting in a higher current in the input voltage transistor branch than the current in the reference voltage transistor branch.

When the input voltage IN increases to the reference voltage VREF, the resistance of the transistor P22 increases and becomes equal to the resistance of the reference-voltage transistor P23. Since the node Y is low, the transistor P24 is ON, resulting in the effective resistance of the transistors P22 and P24 becoming less than the resistance of the transistors P23 and P25. Thus, the current in the input voltage transistor branch remains greater than that in the reference voltage transistor branch, keeping the voltage at the output node OUT low, the voltage at the node X high, and the voltage at the node Y low.

Further increase in the input voltage IN increases the resistance of the input voltage transistor branch until it is equal to the resistance of the reference voltage transistor branch, resulting in an equal current through both the branches. Any increase in the input voltage IN beyond this point causes a higher current in the reference voltage branch than the current in the input voltage branch. This makes the voltage at the output node OUT high, and at nodes X, Y it is low and high, respectively. This switches the transistor P25 ON and the transistor P24 OFF, which further increases the current in the reference voltage transistor branch. Hence, the output goes high at a value VTH which is greater than VREF. So, a hysteresis of VTH-VREF is achieved in a low-to-high transition.

The next case is the high-to-low transition. In this case, the input voltage IN is initially greater than the reference voltage VREF and the output voltage OUT is high, thus the voltages at the nodes X and Y are low and high, respectively. Consequently, the PMOS transistor P25 is ON, and the transistor P24 is OFF. This results in a higher effective resistance of the PMOS transistors P22 and P24 than that of the PMOS transistors P23 and P25. It also results in a greater current in the reference voltage transistor branch compared to the current in the input voltage transistor branch.

When the input voltage IN decreases to VREF, the resistance of the MOS transistor P22 becomes equal to the resistance of the transistor P23. Since the PMOS transistor P25 is ON and the PMOS transistor P24 is OFF, the effective resistance of the MOS transistors P22 and P24 is still higher than the effective resistance of the PMOS transistors P23 and P25. This keeps the current in the reference voltage transistor branch higher than the current in input voltage transistor branch, and the voltage at the node OUT high.

Further decrease in input voltage IN decreases the resistance of the PMOS transistor P22, equalizing the effective resistance of the input voltage branch and the reference voltage branch. This results in an equal amount of current through both branches. A decrease in the input voltage IN beyond this leads to a higher effective resistance of the PMOS transistor pair P23 and P25 than the effective resistance of the PMOS transistors pair P22 and P24. This results in greater current through the input voltage transistor branch compared to the current through the reference voltage transistor branch, bringing the output low. Since the voltage at the node X is high and the voltage at the node Y is low, the transistor P24 is switched ON while the transistor P25 is switched OFF.

Moreover, this further reduces the effective resistance of the transistors P22 and P24 and increases the current in the input voltage transistor branch. This brings the output LOW when the input voltage IN is at threshold voltage VTL which is less than VREF, thereby achieving a hysteresis value of VREF-VTL for a high-to-low transition.

The value of the hysteresis VTH-VTL may be increased or decreased by adjusting the size of the MOS transistors P24 and P25, while the transition times may be changed by varying the sizes of the inverters I21 and I22. The inverters I20 and I21 also improve the output swing providing rail-to-rail output. The gates of the parallel transistors P24 and P25 are connected to the outputs of the inverters I20 and I21, providing a wide hysteresis using relatively smaller sizes of transistors.

That which is claimed is:

1. A differential receiver providing symmetrical hysteresis and comprising:
    a differential amplifier having a plurality of inputs and an output and comprising a plurality of input transistors, each input transistor having a control terminal and first and second conduction terminals, the first conduction terminals of said input transistors being connected together, and the control terminals of said input transistors each being connected to a respective one of the inputs of said differential amplifier;
    a plurality of buffers cascade-connected to the output of said differential amplifier; and
    a plurality of feedback transistors each having a control terminal and first and second conduction terminals, the first and second conduction terminals of each feedback transistor respectively being connected to the first and second conduction terminals of a respective input transistor of the plurality of input transistor to provide a parallel connection therebetween, and the control terminal of each feedback transistor being connected to the output of a respective buffer of the plurality of buffers;
    said feedback transistors providing positive feedback to cause switching at the output of said differential amplifier when a first input voltage at one of the input terminals of said differential amplifier increases above or decreases below a second input voltage at another one of the input terminals of said differential amplifier by a predetermined threshold.

2. The differential receiver of claim 1 wherein the plurality of inputs of said differential amplifier comprise first and second inputs, and wherein said plurality of input transistors comprises first and second input transistors.

3. The differential receiver of claim 1 wherein at least one of said buffers comprises an inverter.

4. The differential receiver of claim 1 wherein each of said buffers comprises a digital buffer.

5. The differential receiver of claim 1 wherein the second input voltage comprises a reference voltage.

6. The differential receiver of claim 1 wherein the output of said differential amplifier is connected to an input of a first one of said cascade-connected buffers.

7. An electronic circuit comprising:
    a differential amplifier having a plurality of inputs and an output and comprising a plurality of input transistors, each input transistor having a control terminal and first and second conduction terminals, the first conduction terminals of said input transistors being connected together, and the control terminals of said input transistors each being connected to a respective one of the input of said differential amplifier;
    a plurality of buffers cascade-connected to the output of said differential amplifier; and
    a plurality of feedback transistors each having a control terminal and first and second conduction terminals, the first and second conduction terminals of each feedback transistor respectively being connected to the first and second conduction terminals of a respective input transistor of the plurality of input transistor to provide a parallel connection therebetween, and the control terminal of each feedback transistor being connected to the output of a respective buffer of the plurality of buffers.

8. The electronic circuit of claim 7 wherein the plurality of inputs of said differential amplifier comprise first and second inputs, and wherein said plurality of input transistors comprises first and second input transistors.

9. The electronic circuit of claim 7 wherein at least one of said buffers comprises an inverter.

10. The electronic circuit of claim 7 wherein each of said buffers comprises a digital buffer.

11. The electronic circuit of claim 7 wherein the one of the plurality of inputs of said differential amplifier receives a reference voltage.

12. The electronic circuit of claim 7 wherein the output of said differential amplifier is connected to an input of a first one of said cascade-connected buffers.

13. A method for making an electronic circuit comprising:
    providing a differential amplifier having a plurality of inputs and an output and comprising a plurality of input transistors, each input transistor having a control terminal and first and second conduction terminals, the first conduction terminals of the input transistors being connected together, and the control terminals of the input transistors each being connected to a respective one of the input of the differential amplifier;
    cascade-connecting a plurality of buffers to the output of the differential amplifier;
    providing a plurality of feedback transistors each having a control terminal and first and second conduction terminals;

connecting the first and second conduction terminals of each feedback transistor respectively to the first and second conduction terminals of a respective input transistor of the plurality of input transistor to provide a parallel connection therebetween; and connecting the control terminal of each feedback transistor to the output of a respective buffer of the plurality of buffers.

14. The method of claim 13 wherein the plurality of inputs of the differential amplifier comprise first and second inputs, and wherein the plurality of input transistors comprises first and second input transistors.

15. The method of claim 13 wherein at least one of said buffers comprises an inverter.

16. The method of claim 13 wherein one of the plurality of inputs of said differential amplifier receives a reference voltage.

* * * * *